(12) United States Patent
Watanabe

(10) Patent No.: US 9,054,759 B2
(45) Date of Patent: Jun. 9, 2015

(54) VSWR MEASUREMENT CIRCUIT, RADIO COMMUNICATION APPARATUS, VSWR MEASUREMENT METHOD, AND RECORDING MEDIUM HAVING VSWR MEASUREMENT PROGRAM STORED THEREON

(75) Inventor: Junji Watanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 14/114,499

(22) PCT Filed: May 29, 2012

(86) PCT No.: PCT/JP2012/003489
§ 371 (c)(1),
(2), (4) Date: Oct. 28, 2013

(87) PCT Pub. No.: WO2012/164905
PCT Pub. Date: Dec. 6, 2012

(65) Prior Publication Data
US 2014/0050282 A1    Feb. 20, 2014

(30) Foreign Application Priority Data

May 30, 2011    (JP) .................. 2011-120035

(51) Int. Cl.
*H04K 1/02*    (2006.01)
*H04L 25/03*    (2006.01)
(Continued)

(52) U.S. Cl.
CPC ............ *H04B 1/0475* (2013.01); *H03F 1/3247* (2013.01); *H03F 3/24* (2013.01);
(Continued)

(58) Field of Classification Search
USPC .......................................... 375/296
See application file for complete search history.

(56) References Cited

U.S. PATENT DOCUMENTS 7,415,250 B2    8/2008    Sasaki et al.
8,014,736 B2    9/2011    Yokoyama et al.
(Continued)

FOREIGN PATENT DOCUMENTS

JP    H9-153849 A    6/1997
JP    2004-286632 A    10/2004
(Continued)

OTHER PUBLICATIONS

International Search Report (ISR) (PCT Form PCT/ISA/210), in PCT/JP2012/003489, dated Aug. 28, 2012.
(Continued)

*Primary Examiner* — Shuwang Liu
*Assistant Examiner* — Nader Bolourchi
(74) *Attorney, Agent, or Firm* — McGinn IP Law Group, PLLC.

(57) ABSTRACT

In this VSWR measurement circuit, a power measurement unit measures the power level of a reflected signal which is included in a feedback signal which has been extracted at a second CPL which has been deployed at a position connecting to an antenna end via a cable. To this end, the VSWR measurement circuit is provided with a main signal component removal circuit, wherein the main signal which has been extracted from the prestage of a digital pre-distortion circuit, and a signal in which the feedback signal that had been extracted at the second CPL has been converted to a digital signal at an A/D CONV, are provided as inputs, the main signal component included in the feedback signal is removed, and only the reflected signal is extracted so as to be output to the power measurement unit.

10 Claims, 4 Drawing Sheets

(51) Int. Cl.
*H04L 25/49* (2006.01)
*H04B 1/04* (2006.01)
*H03F 1/32* (2006.01)
*H03F 3/24* (2006.01)
*H03F 3/195* (2006.01)

(52) U.S. Cl.
CPC ..... *H03F2200/171* (2013.01); *H03F 2200/204* (2013.01); *H03F 2200/207* (2013.01); *H03F 3/195* (2013.01); *H03F 2200/105* (2013.01); *H03F 2200/465* (2013.01); *H04B 2001/0425* (2013.01)

(56) References Cited

U.S. PATENT DOCUMENTS

| | | | |
|---|---|---|---|
| 2005/0101254 A1 | 5/2005 | Sasaki et al. | |
| 2007/0096919 A1* | 5/2007 | Knadle et al. | 340/572.8 |
| 2009/0207896 A1 | 8/2009 | Behzad | |
| 2009/0298446 A1 | 12/2009 | Yokoyama et al. | |
| 2011/0050515 A1* | 3/2011 | Liu | 343/703 |
| 2011/0273242 A1* | 11/2011 | Totani et al. | 333/116 |

FOREIGN PATENT DOCUMENTS

| | | |
|---|---|---|
| JP | 2005-142881 A | 6/2005 |
| JP | 2009-290375 A | 12/2009 |
| JP | 2010-57012 A | 3/2010 |
| WO | WO 2012/042625 A1 | 4/2012 |

OTHER PUBLICATIONS

Japanese Office Action dated Feb. 3, 2015 with a partial English translation thereof.

Japanese Decision of Grant a Patent dated Apr. 21, 2015 with an English translation.

* cited by examiner

US 9,054,759 B2

VSWR MEASUREMENT CIRCUIT, RADIO COMMUNICATION APPARATUS, VSWR MEASUREMENT METHOD, AND RECORDING MEDIUM HAVING VSWR MEASUREMENT PROGRAM STORED THEREON

CROSS REFERENCE TO RELATED APPLICATIONS

This application is the US National Stage of, and therefore claims the benefit of International Application No. PCT/JP2012/003489, accorded an international filing date of May 29, 2012, entitled "VSWR MEASUREMENT CIRCUIT, RADIO COMMUNICATION APPARATUS, VSWR MEASUREMENT METHOD, AND RECORDING MEDIUM HAVING VSWR MEASUREMENT PROGRAM STORED THEREON," which claims the priority of Japanese Patent Application No. 2011-120035, filed on May 30, 2011, the content of both of which are incorporated herein, in their entirety by reference.

TECHNICAL FIELD

The present invention relates to a VSWR (Voltage Standing Wave Ratio) measurement circuit, a radio communication apparatus, a VSWR measurement method, and a recording medium having a VSWR measurement program stored thereon.

BACKGROUND ART

A recent radio communication apparatus that transmits and receives a radio signal of a cell phone base station or the like has highly advanced in functions, and as one of the functions, it is often strongly required that the radio communication apparatus is provided with a function to determine by measuring a VSWR (Voltage Standing Wave Ratio) normality and matching of a cable and an antenna body that have been connected to an antenna terminal. Furthermore, not only failure detection of the cable and the antenna but also an accuracy of the measured VSWR value are required in many cases.

For example, in Japanese Unexamined Patent Application Publication No. 2009-290375 as Patent Literature 1 "DIGITAL PRE-DISTORTION APPARATUS, RADIO COMMUNICATION APPARATUS, AND DIGITAL PRE-DISTORTION METHOD", a technology has been proposed in which as a digital pre-distortion apparatus for removing a distortion component of a main signal to be transmitted, when the main signal to be transmitted is amplified at an appropriate level to try to supply an antenna terminal, not only a part of the main signal is fed back to compensate a distortion component, but also a power component of a signal supplied to the antenna terminal is extracted in a VSWR unit apart from a feedback route for DPD (Digital Pre-Distortion) control to be fed back, and thereby a compensation coefficient for correcting distortion of the transmission signal is calculated based on the extracted distortion component and power component, thereby enabling to perform digital pre-distortion more accurately.

CITATION LIST

Patent Literature

[Patent Literature 1]
Japanese Unexamined Patent Application Publication No. 2009-290375 (5-7 pages)

SUMMARY OF INVENTION

Technical Problem

However, a current VSWR measurement function in Patent Literature 1 or the like has the following problems.

A first problem lies in a fact that in order to detect a VSWR, a large directional coupler (or a circulator) for extracting a power component specifically for VSWR measurement, a highly accurate detector for power measurement, and a circuit for feeding back the detected power to a baseband unit are needed, and that furthermore, in order to perform highly accurate VSWR measurement, the circuit is increased in size, which is not suitable for recent development of a radio communication apparatus for which reduction in size and reduction in price are required.

A second problem lies in a fact that a critical circuit design needs to be performed in order to achieve highly accurate VSWR measurement at low cost, and that advanced adjustment action is required in order to absorb individual differences.

Problems of conventional VSWR measurement will be further described using block configurations of a conventional VSWR measurement circuit shown in FIGS. 3 and 4. FIG. 3 is a block configuration diagram showing one example of the block configuration of the conventional VSWR measurement circuit, and it shows a case where apart from a first CPL (First Directional Coupler) for taking out a signal for DPD (digital pre-distortion) control, a second CPL (Second Directional Coupler) is arranged in a position connected to an antenna terminal through a cable in order to separately extract a main signal and a reflection signal for VSWR measurement. Moreover, FIG. 4 is a block configuration diagram showing an other example of the block configuration of the conventional VSWR measurement circuit, and it shows a case where a CIR (Circulator) is arranged at a position connected to the antenna terminal through the cable instead of the second CPL (the second directional coupler) in order to separately extract a main signal and a reflection signal for VSWR measurement.

The VSWR measurement circuit of FIG. 3 is, as mentioned above, provided with a second CPL 7 (second directional coupler 7) for forming a feedback route for VSWR measurement apart from a first CPL 5 (first directional coupler 5) for forming a feedback route for DPD (digital pre-distortion) control, and it is configured such that the main signal and the reflection signal are separately extracted in the second CPL 7, they are supplied to a detector 17 appropriately being switched by a high-frequency switch SW 8, and that thereby level detection of the respective signals is performed in the detector 17. In such circuit configuration, the better impedance matching with the cable connected to the antenna terminal and the antenna becomes, the lower a level of the reflection signal becomes, and thus not less than 20 dB is needed as directivity of the second CPL 7 that makes it possible to accurately extract only the reflection signal in order to accurately measure the VSWR. In order to achieve such directivity, a line length of the second CPL 7 needs to be a length close to approximately one-fourth of a signal wavelength.

Accordingly, the lower a frequency becomes, the larger a size of the second CPL 7 becomes, and thus there is a problem that the second CPL 7 is a significantly major presence in a frequency band used in a radio communication apparatus, such as a cell phone. Moreover, in addition to the necessity of design also paying attention to isolation between a signal on the feedback route for VSWR measurement from the second CPL 7 to the high-frequency switch SW 8 and a signal on the feedback route for DPD control, an IC (Integrated Circuit) is used in consideration of an interface between the detector 17 and a Baseband unit 1, and thus design taken into account wiring of a power supply and a mounting position is required, which becomes a hindrance factor of reduction in price and reduction in size.

Meanwhile, the VSWR measurement circuit of FIG. 4 is, as mentioned above, configured using the CIR 18 (circulator 18) instead of the second CPL 7 of FIG. 3. In FIG. 4, by using such CIR 18 (circulator 18), it is necessary to have a circuit configuration that reduces an effect of the main signal by high isolation performance of the CIR 18 similarly to the case of using the second CPL 7 having high directivity in FIG. 3, However, since a circulator with high power durability is needed in order to make isolation high also in such VSWR measurement circuit of FIG. 4, increase in price and increase in size cannot be avoided similarly to the case of FIG. 3.

Object of the Present Invention

The present invention has been made to solve such problems, and an object thereof is to provide a VSWR measurement circuit, a radio communication apparatus, a VSWR measurement method, and a recording medium having a VSWR measurement program stored thereon that can be reduced in size and price, and can achieve a highly accurate VSWR measurement function.

Solution to Problem

In order to solve the above-mentioned problems, a VSWR measurement circuit, a radio communication apparatus, a VSWR measurement method, and a recording medium having a VSWR measurement program stored thereon according to the present invention mainly employ the following characteristic configurations.

(1) A VSWR measurement circuit according to the present invention includes: a first directional coupler that extracts a partial main signal of main signals amplified by a power amplifier in order to transmit from an antenna; an analog/digital converter that converts the main signal extracted by the first directional coupler; a distortion compensation circuit that performs distortion compensation by using the signal converted by the analog/digital converter; a second directional coupler that is connected to an antenna terminal through a cable, and extracts a reflection signal included in feedback signals; a power measurement unit that performs power measurement of the main signal extracted by the first directional coupler and the reflection signal extracted by the second directional coupler, respectively, and measures a VSWR (Voltage Standing Wave Ratio); and a main signal component removing circuit that removes a main signal component included in the feedback signals to output to the power measurement unit, with the main signal taken out from a preceding stage of the distortion compensation circuit and signals in which the feedback signals are converted into digital signals by the analog/digital converter being set as inputs.

(2) A radio communication apparatus according to the present invention, in the radio communication apparatus transmits and receives a radio signal, includes the VSWR measurement circuit according to at least above (1) as a circuit that measures a VSWR in the cable connected to the antenna terminal and the antenna.

(3) A VSWR measurement method according to the present invention includes: extracting, by a first directional coupler, a partial main signal of main signals amplified by a power amplifier in order to transmit from an antenna; converting, by an analog/digital converter, the extracted main signal; performing distortion compensation, by a distortion compensation circuit, by using the converted signal; extracting, by a second directional coupler that is connected to an antenna terminal through a cable, a reflection signal included in feedback signals; by a power measurement unit, performing power measurement of the main signal extracted by the first directional coupler and the reflection signal extracted by the second directional coupler, respectively, and measuring a VSWR (Voltage Standing Wave Ratio); and removing a main signal component included in the feedback signals to output to the power measurement unit, with the main signal taken out from a preceding stage of the distortion compensation circuit and signals in which the feedback signals are converted into digital signals by the analog/digital converter being set as inputs.

(4) A recording medium having a VSWR measurement program stored thereon according to the present invention stores a program that can execute the VSWR measurement method according to at least above (3) by a computer.

Advantageous Effects of Invention

According to the VSWR measurement circuit, the radio communication apparatus, the VSWR measurement method, and the recording medium having the VSWR measurement program stored thereon of the present invention, the following effects can be exerted.

A first effect is that since a main signal and a reflection signal for VSWR (Voltage Standing Wave Ratio) measurement can be extracted with high accuracy, it becomes possible to accurately measure a VSWR in a wide range from a state where the VSWR value is large (poor) to a state where it is small (good).

A second effect is that since for VSWR measurement, a main signal component removing circuit is introduced that can divert a part of a DPD (Digital Pre-Distortion) control loop for distortion compensation, and improve extraction accuracy of the reflection signal by digital processing, a mechanism to extract and feed back a signal in a position connected to an antenna terminal through a cable can be configured with an inexpensive directional coupler and a high-frequency switch, and a very small-sized and inexpensive VSWR measurement circuit can be achieved.

A third effect is that it becomes possible to achieve automation and reduction of the number of steps in manufacturing of the VSWR measurement circuit without needing tuning by advanced adjustment or the like in order to secure accuracy of VSWR measurement.

DESCRIPTION OF EMBODIMENTS

Figure 1:
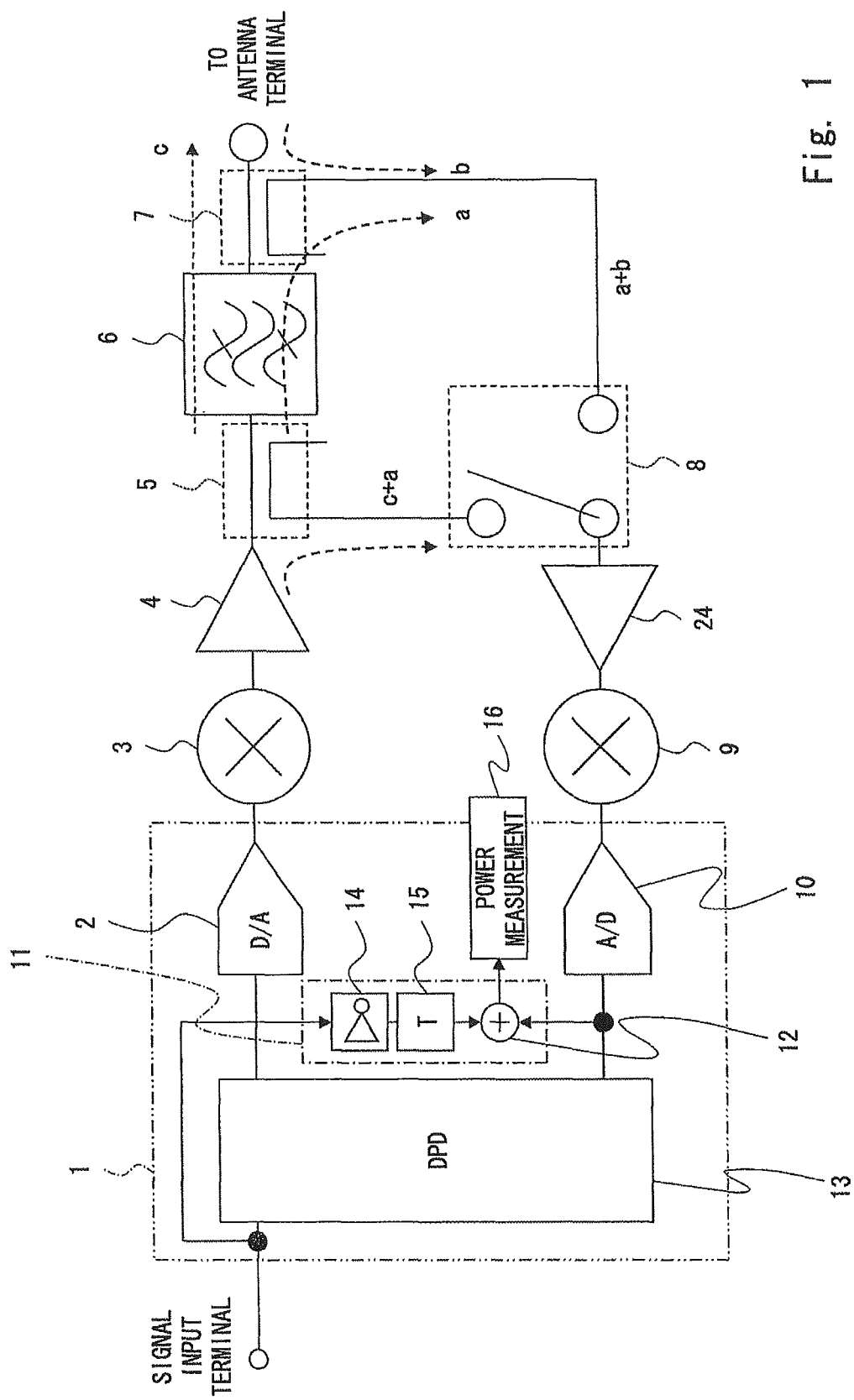
FIG. 1 is a block configuration diagram showing one example of the block configuration of the VSWR measurement circuit according to the present invention.

Hereinafter, with reference to accompanying drawings, will be described a preferred embodiment of a VSWR (Voltage Standing Wave Ratio) measurement circuit, a radio communication apparatus, a VSWR measurement method, and a recording medium having a VSWR measurement program stored thereon. It is to be noted that although the VSWR measurement circuit and the VSWR measurement method according to the present invention will be described in the following description, in the radio communication apparatus that transmits and receives a radio signal, the above-described VSWR measurement circuit may be configured to be mounted as a circuit that measures a VSWR in a cable connected to an antenna terminal, an antenna, and the like, or the above-described VSWR measurement method may be implemented as a computer-executable VSWR measurement program.

(Feature of the Present Invention)

Prior to description of the embodiment of the present invention, a summary of the feature of the present invention will be first described. A main feature of the present invention is that a mechanism is employed that can achieve with high accuracy, inexpensiveness, and small size a function to measure a VSWR (Voltage Standing Wave Ratio) of a cable, an antenna, or the like that is connected to an antenna terminal of the radio communication apparatus in a cell phone base station or the like.

More specifically, in the present invention, the small-sized and inexpensive VSWR measurement circuit is achieved by the following circuit configuration, while satisfying desired performance.

The present invention is configured such that a feedback route for distortion compensation (DPD: Digital Pre-Distortion) control and a feedback route for VSWR measurement are shared, and that provided is a main signal component removing circuit for effectively removing a main signal component included in a reflection signal for VSWR measurement by digital signal processing. That is, the feedback route for VSWR measurement and the shared feedback route for DPD control are appropriately switched by a high-frequency switch SW 8 at the time of DPD control and at the time of level detection of the main signal for VSWR measurement, and at the time of level detection of the reflection signal for VSWR measurement.

Furthermore, at the time of level detection of the reflection signal for VSWR measurement, an opposite phase signal of the main signal is added to a feedback signal output to the feedback route from a second CPL (Second Directional Coupler) connected to the antenna terminal through the cable, and thereby a main signal component included in the feedback signal is canceled, and only the reflection signal is extracted with high accuracy, thereby enabling to accurately detect the level of the reflection signal.

Although the reflection signal is taken in by the second CPL 7 arranged at the position connected to the antenna terminal through the cable to be output to the feedback route, this second CPL 7 is configured to have small directivity in order to achieve small size and low price. However, when it is configured to have small directivity, not only the reflection signal but also a number of main signal components are included in the feedback signal output to the feedback route. Particularly, when the VSWR value is small (good), the main signal level may become larger than the reflection signal level in the feedback signal taken in by the second CPL 7, and level detection of the reflection signal becomes difficult. In order to eliminate such a circumstance, in the present invention, digital conversion of the feedback signal is performed, the converted signal is input into the main signal component removing circuit together with the main signal input from an input terminal of the VSWR measurement circuit, the main signal from the input terminal of the VSWR measurement circuit is utilized, thereby the main signal component included in the feedback signal is removed, and only the reflection signal is extracted.

That is, in the main signal component removing circuit, the main signal input from the input terminal of the VSWR measurement circuit is first converted into an opposite phase, subsequently, the signal converted into the opposite phase is generated as a delayed signal (delay signal) by a elapse time until the signal is taken in by the second CPL 7 after transmission of a signal output from a DPD circuit of the VSWR measurement circuit and is returned via the feedback route as a feedback signal, the generated signal (delay signal) and the feedback signal to which digital conversion has been performed are added, thereby the main signal component included in the feedback signal is removed, and only the pure reflection signal is extracted.

Accordingly, it becomes possible to measure a power level of the extracted reflection signal with high accuracy in a power measurement unit, and a VSWR value can be calculated with high accuracy based on the power level of the reflection signal measured at the time of level detection of the reflection signal for VSWR measurement, and a power level of the main signal measured at the time of level detection of the main signal for VSWR measurement without using a large-sized directional coupler, an expensive circulator, and a highly accurate detector.

(Configuration Example of Embodiment)

Next, with reference to FIG. 1, will be described in detail a block configuration of the VSWR measurement circuit according to the present invention. FIG. 1 is a block configuration diagram showing one example of the block configuration of the VSWR measurement circuit according to the present invention, and similarly to a case of a conventional technology, it shows a case where a second CPL (Second Directional Coupler) is arranged in a position connected to an antenna terminal through a cable in order to combine with standard distortion compensation circuit (DPD: Digital Pre-Distortion) and to extract a reflection signal.

In the VSWR measurement circuit of FIG. 1, a main signal to be transmitted is first input to a distortion compensation circuit 13 in the Baseband unit 1 (baseband unit 1) arranged at an input terminal of the VSWR measurement circuit. The main signal as an output of the DPD circuit 13 is converted into an analog signal in a D/A CONV 2 (digital/analog converter 2). An output signal of the D/A CONV 2 is output to the first CPL 5 (first directional coupler 5) through an Up Converter 3 (up-converter 3) and a first PA 4 (first power amplifier 4). The first PA 4 amplifies an output of the Up Converter 3 so that an output signal from an antenna is an appropriate level. A part of the main signal extracted in the first CPL 5 is sent to a Down Converter 9 (down-converter 9) through the high-frequency switch SW 8 and a second PA 24 (second power amplifier 24). The second PA 24 (second power amplifier 24) and the Down Converter 9 (down-converter 9) are circuits that are included in a part of the feedback route for DPD control. The Down Converter 9 frequency-converts the main signal extracted by the first CPL 5 into an IF (Intermediate Frequency). The main signal frequency-converted into the IF is taken in in the Baseband unit 1. The Baseband unit 1 converts the taken-in main signal into a digital signal by an A/D CONV 10 (analog/digital converter 10), and inputs this digital signal to the DPD 13 (DPD circuit 13). The DPD 13 performs DPD processing of the main signal to be transmitted by a general DPD method using a digital signal processing technology based on the digital signal as an output of the A/D CONV 10.

For VSWR (Voltage Standing Wave Ratio) measurement, it is necessary to measure both the level of the main signal and the level of the reflection signal. Measurement of the main signal level is performed by a signal for DPD control extracted through the first CPL 5. Meanwhile, in order to measure the level of the reflection signal, an output of the first CPL 5 is supplied to the second CPL 7 (second directional coupler 7) through a BPF 6 (band pass filter 6). The second CPL 7 extracts the reflection signal, and supplies the extracted reflection signal to a circuit for level measurement (power measurement unit 16) that will be mentioned later. An output terminal of the second CPL 7 is connected to an antenna terminal through a cable.

The signal extracted in the second CPL 7 is sent to the high-frequency switch SW 8 in order to measure the level of the reflection signal. As described above, in the VSWR measurement circuit of the embodiment of FIG. 1, the high-frequency switch SW 8 is included in a feedback route for feeding back the reflection signal to the circuit for level measurement (power measurement unit 16) of the reflection signal. As mentioned above, the high-frequency switch SW 8 is also a circuit in the feedback route for DPD control. Accordingly, the high-frequency switch SW 8 is incorporated in both the feedback route for DPD control and a feedback route for reflection signal level measurement. By providing the high-frequency switch SW 8, the second PA 24 (second power amplifier 24), the Down Converter 9, and the A/D CONV 10 that are a part of the feedback route for DPD control are used also for the feedback route for VSWR measurement. As mentioned below, the VSWR measurement circuit of the embodiment can be achieved even if not only the reflection signal but also the main signal are included in the signal that is extracted by the second CPL 7 and is sent to the high-frequency switch SW 8. In the description of the embodiment, since in addition to the reflection signal, the main signal is included in the signal extracted by the second CPL 7, the signal that is extracted by the second CPL 7 and sent to the high-frequency switch SW 8 is referred to as a feedback signal. As described above, in the embodiment, as will be described in detail later, since the VSWR can be accurately measured even if in addition to the reflection signal, the main signal is included in the feedback signal extracted by the second CPL 7 arranged at a position connected to the antenna terminal through the cable, as the second CPL 7, a circuit using a large-sized directional coupler having high directivity and an expensive circulator are not used, but a circuit having such a small configuration that is inexpensive and has a line length substantially shorter than a quarter of a wavelength, although the circuit has low directivity, can be used.

Consequently, the second CPL 7 in the embodiment is set to be a small-sized one whose line length is substantially shorter than a quarter of the wavelength, and that is inexpensive. Since the small-sized and inexpensive CPL is used as the second CPL 7, not only the reflection signal but a number of main signal components are included in the extracted feedback signal. In order to be able to accurately measure the VSWR even if in addition to the reflection signal, a number of main signal components are included in the feedback signal, in the Baseband unit 1, the VSWR measurement circuit of FIG. 1 is provided with a main signal component removing circuit 11 for removing the main signal components included in the extracted feedback signal. The main signal component removing circuit 11 is configured to have an inverter 14, a delay circuit 15, and an adder 12. Here, the inverter 14 is a circuit that inverts to an opposite phase the main signal taken out from a preceding stage (i.e., a signal input terminal of a transmission signal) of the DPD circuit 13 arranged at the input terminal of the VSWR measurement circuit.

Moreover, the delay circuit 15 is a circuit for delaying the opposite phase signal from the inverter 14 by a delay amount of a total signal paths of a signal path from the DPD circuit 13 to the second CPL 7 and a signal path from the second CPL 7 to the A/D CONV 10. Namely, the delay circuit 15 is provided in order to obtain a delay signal in which the opposite phase signal from the inverter 14 has been delayed by a time until the signal output from the DPD circuit 13 reaches the second CPL 7, and is fed back to the main signal component removing circuit 11 as the feedback signal through the feedback route for DPD control.

Moreover, the adder 12 is a circuit for adding the delay signal output from the delay circuit 15 and the feedback signal output from the A/D CONV 10, and canceling the main signal components included in the feedback signal.

Action of the main signal component removing circuit 11 will be described in more detail. In the main signal component removing circuit 11, a main signal taken out from the preceding stage of the DPD circuit 13, and a signal in which the feedback signal extracted by the second CPL 7 has been converted into a digital signal by the A/D CONV 10 (analog/digital converter 10) are set as inputs. First, the main signal taken out from the preceding stage of the DPD circuit 13 is then converted into the opposite phase in the inverter 14, and data converted into the opposite phase is added to the delay circuit 15. In the delay circuit 15, the opposite-phase converted data as the output of the inverter 14 is delayed until a timing when the signal output from the DPD circuit 13 is output from the A/D CONV 10 (analog/digital converter 10) through the feedback route as the feedback signal (signal including the reflection signal and the main signal components) extracted in the second CPL 7. After that, the data (delay signal) delayed in the delay circuit 15 is added by the adder 12 to the data (i.e., the signal in which the feedback signal has been converted into the digital signal) taken in from the A/D CONV 10 (analog/digital converter 10). By the addition by the adder 12, the main signal components are removed from the signal (feedback signal) extracted in the second CPL 7, and only a pure reflection signal component is obtained. In this way, the main signal component removing circuit 11 can output the pure reflection signal component to the power measurement unit 16.

(Description of Operation of Embodiment)

Figure 2:
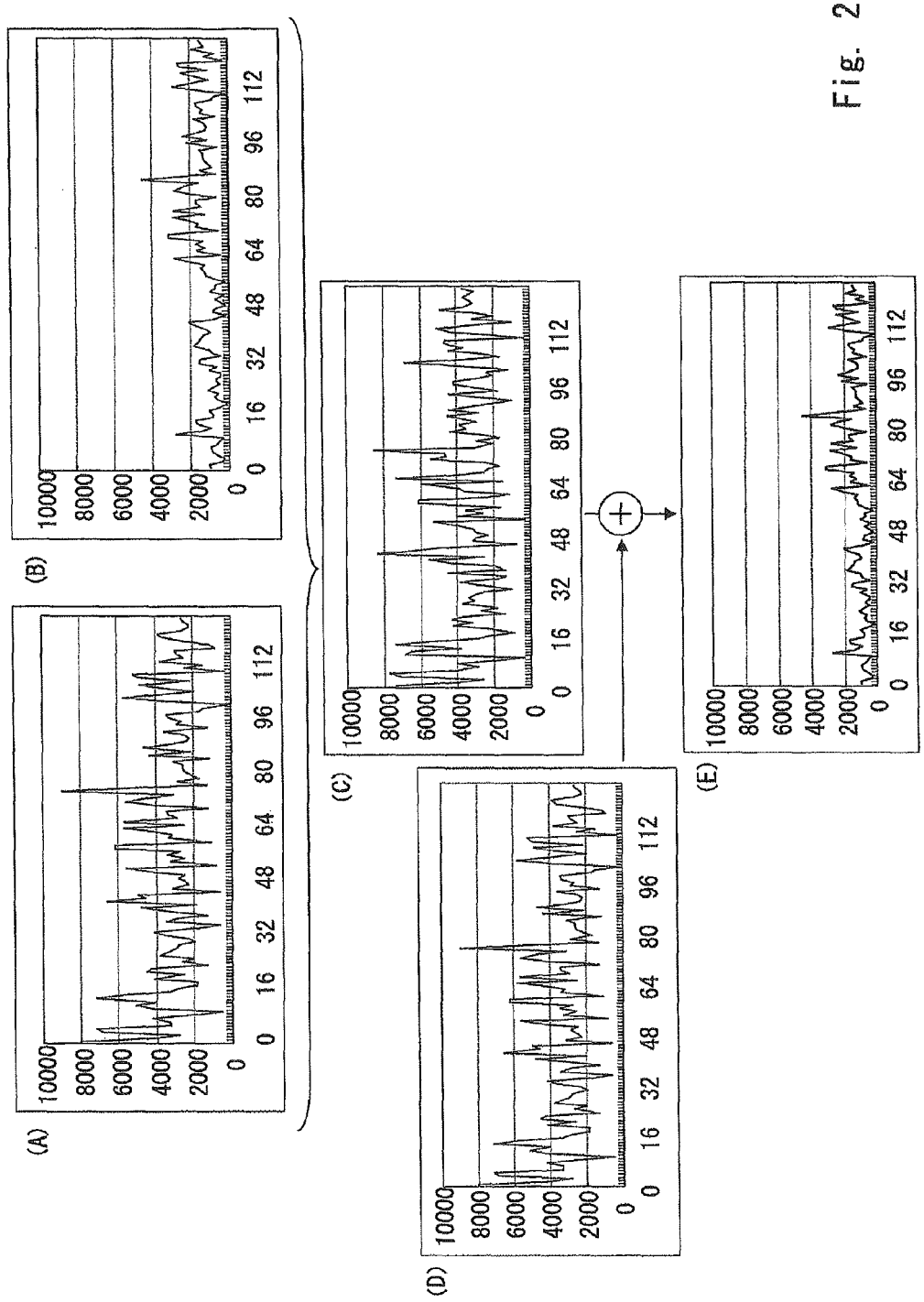
FIG. 2 is a waveform chart for illustrating an extraction image of the reflection signal in the VSWR measurement circuit shown in FIG. 1.

Next, operation of the VSWR measurement circuit shown in FIG. 1 as one embodiment of the present invention will be described in more detail. FIG. 2 is a waveform chart for illustrating an extraction image of the reflection signal in the VSWR measurement circuit shown in FIG. 1, FIG. 2(A) shows a waveform of a main signal, FIG. 2(B) shows a waveform of a reflection signal, and FIG. 2(C) shows a composite waveform of the main signal and the reflection signal. Moreover, FIG. 2(D) shows a waveform of an opposite phase of the main signal, and FIG. 2(E) shows a waveform of a reflection signal generated as an addition result of the composite waveform of FIG. 2(C) and the opposite phase waveform of FIG. 2(D).

When the VSWR is measured, RL (Return Loss) is calculated by respectively measuring a main signal level and a reflection signal level by the power measurement unit 16, and the VSWR is calculated using the next expression (1) using the calculated RL.

$$VSWR = (1+10^{(RL/20)})/(1-10^{(RL/20)}) \quad (1)$$

The main signal level is measured by the following: in the VSWR measurement circuit shown in FIG. 1, the high-frequency switch SW 8 is set on a first CPL 5 side; and data extracted in the first CPL 5 that has been arranged on an output side of a first PA 4 (first power amplifier 4) as a feedback loop of the main signal for performing DPD is output to the power measurement unit 16 of the Baseband unit 1 through the feedback route for DPD control of the SW 8, the second PA 14 (second power amplifier 14), the Down Converter 9 (down-converter 9), and the A/D CONV 10 (analog/digital converter 10); and the measurement is performed in the power measurement unit 16.

Here, in order to calculate the VSWR with high accuracy, as shown in FIG. 1, it is necessary to calculate a transmission output level c of the main signal to the antenna terminal. In order to calculate the transmission output level c of the main signal, subtraction processing is needed that subtracts a level a (i.e., a level in consideration of a loss of the BPF 6 and directivity of the second CPL 7) from a level (c+a) extracted in the first CPL 5. This subtraction processing is performed by converting a level of each signal into a power level.

In contrast with this, when the reflection signal level is measured, used is the feedback route for DPD control formed by setting the SW 8 on the second CPL 7 side. That is, if directivity of the second CPL 7 is large, signals extracted in the second CPL 7 arranged at the position connected to the antenna terminal through the cable can be made to be substantially only reflection signals, thus the signals extracted in second CPL 7 is output to the power measurement unit 16 of the Baseband unit 1 through the SW 8, the second PA 14 (second power amplifier 14), the Down Converter 9 (down-converter 9), and the A/D CONV 10 (analog/digital converter 10) of the feedback route for DPD control, and they may be measured in the power measurement unit 16.

However, as mentioned above, the inexpensive and small directional coupler is used for the second CPL 7, and it has small directivity. For this reason, even though only a reflection signal reflected from the antenna terminal, i.e., a reflection signal b shown in FIG. 2(B), is tried to be extracted in the second CPL 7, a number of main signal components a from the BPF 6 are included as the composite wave shown in FIG. 2(C). Accordingly, the composite wave (a+b) of FIG. 2(C) is input to the power measurement unit 16 as the feedback signal through the feedback route for DPD control of the SW 8, the second PA 14 (second power amplifier 14), the Down Converter 9, and the A/D CONV 10, and when level measurement of the feedback signal is performed in the power measurement unit 16 as it is, it is difficult to perform accurate level measurement of the reflection signal b due to an effect of the main signal components a.

Particularly, when impedance matching with the cable and the antenna is in a good state, and the VSWR is small (good), it becomes increasingly difficult to accurately measure the level of the reflection signal b since a level of the main signal a is higher than that of the reflection signal b.

Consequently, the VSWR measurement circuit of FIG. 1 is, as mentioned above, configured such that the Baseband unit 1 is further provided with the main signal component removing circuit 11 including the inverter 14, the delay circuit 15, and the adder 12. That is, taken out is the main signal (i.e., the main signal input to the signal input terminal) before input to the DPD circuit 13 arranged at the input terminal of the VSWR measurement circuit, it is output as an opposite phase signal a' converted into an opposite phase in the inverter 14 as shown in FIG. 2(D), the output opposite phase signal a' is added to the composite wave (a+b) of FIG. 2(C) in the adder 12, and thereby the main signal component a included in the signal extracted in the second CPL 7, i.e., the composite wave (a+b), is canceled, thereby enabling to take out a reflection wave from which only the reflection signal b has been extracted as shown in FIG. 2(E).

Naturally, as mentioned above, it is necessary for the opposite phase signal a' to be added to be timely output to the adder 12 in consideration of a delay amount until the composite wave (a+b) in which the main signal component a is included in the reflection signal b is taken in in the A/D CONV 10. Consequently, the main signal, component removing circuit 11 is configured such that the total delay amount from the DPD circuit 13 to the second CPL 7 and from the second CPL 7 to the A/D CONV 10 is set to the delay circuit 15, and that the opposite phase signal a' is accurately delayed by a required delay amount through the delay circuit 15, and is output to the adder 12.

By employing such circuit configuration, only the reflection signal b is extracted with high accuracy among the feedback signals (composite wave (a+b)) taken in in the second CPL 7 to be output to the power measurement unit 16, thereby the level of the reflection signal b is accurately measured in the power measurement unit 16, and a difference (c−b) from the previously calculated transmission output level c of the main signal is calculated, thereby enabling to calculate a return loss RL.

Figure 3:
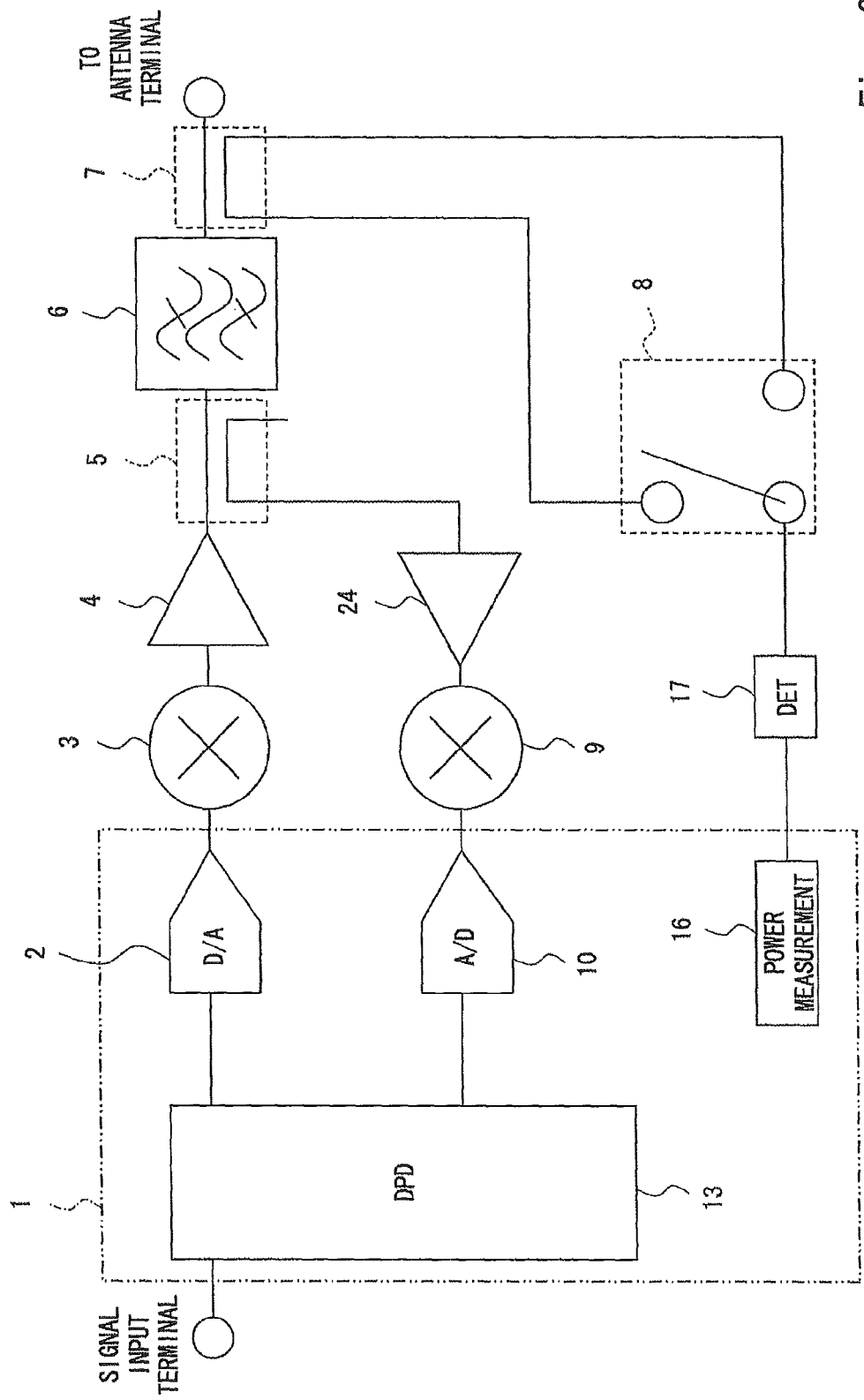
FIG. 3 is a block configuration diagram showing one example of the block configuration of the conventional VSWR measurement circuit.
Figure 4:
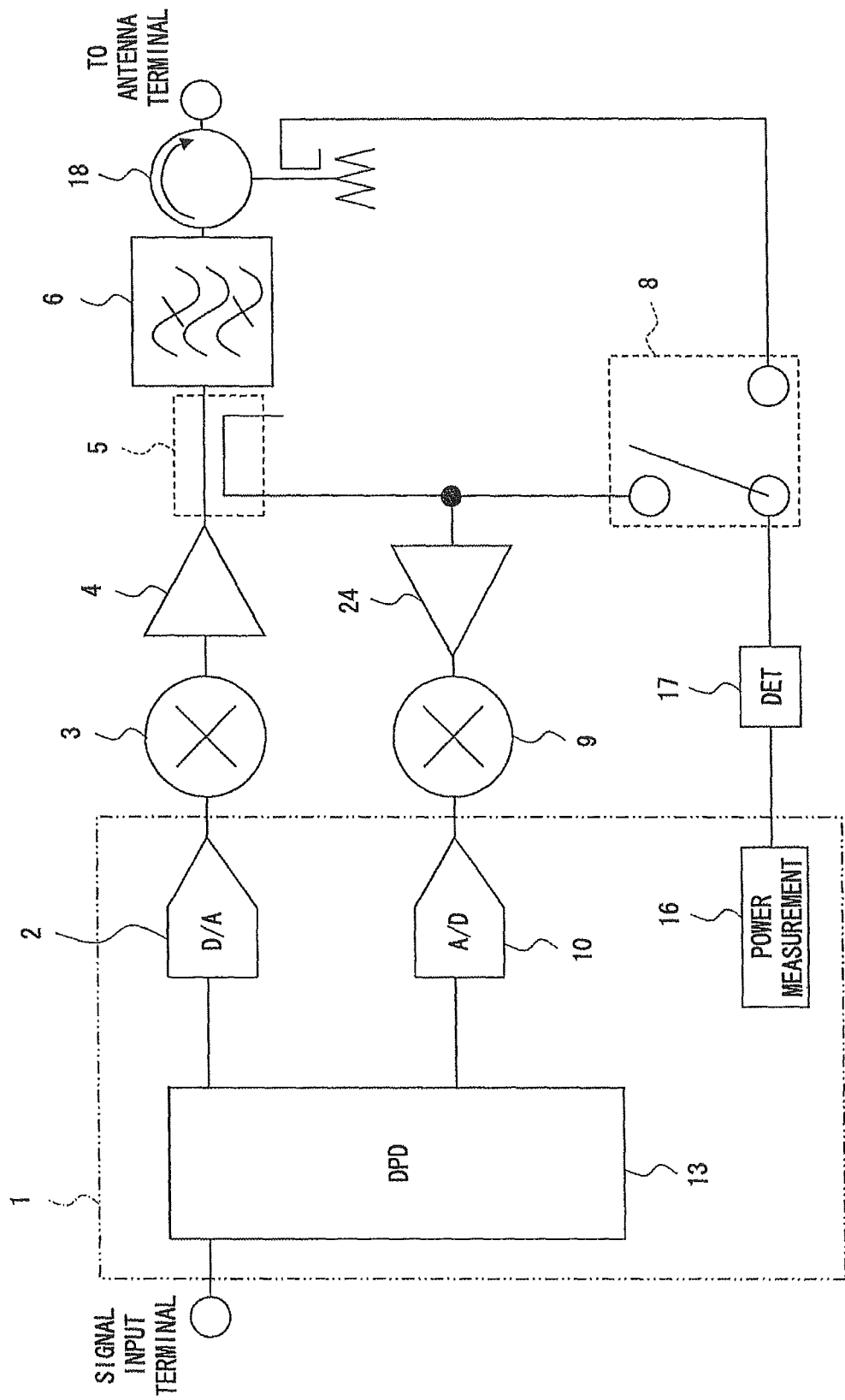
FIG. 4 is a block configuration diagram showing an other example of the block configuration of the conventional VSWR measurement circuit.

Accordingly, it becomes possible to achieve highly accurate VSWR measurement at low cost, without using a directional coupler (large-sized coupler with the length substantially a quarter of the wavelength) with good directivity that has been described in FIG. 3 of the conventional technology, without using an expensive circulator with a high degree of isolation that has been described in FIG. 4, and further without using a dedicated detector for VSWR measurement, as the second CPL 7 that is the directional coupler for extracting the reflection signal b.

(Description of Effects of Embodiment)

As described in detail above, effects that are described hereinafter can be obtained in the embodiment.

A first effect is that since a main signal and a reflection signal for VSWR (Voltage Standing Wave Ratio) measurement can be extracted with high accuracy, it becomes possible to accurately measure a VSWR in a wide range from a state where the VSWR value is large (poor) to a state where it is small (good).

A second effect is that since for VSWR measurement, the main signal component removing circuit 11 is introduced that can divert a part of the DPD (Digital Pre-Distortion) control loop for distortion compensation, and can improve extraction accuracy of the reflection signal by digital processing, a mechanism to extract and feed back a signal in a position connected to an antenna terminal through a cable can be configured using the inexpensive directional coupler (second CPL 7) and the high-frequency switch (SW 8), and that a very small-sized and inexpensive VSWR measurement circuit can be achieved.

A third effect is that it becomes possible to achieve automation and reduction of the number of steps in manufacturing of the VSWR measurement circuit without needing tuning by advanced adjustment or the like in order to secure accuracy of VSWR measurement.

Hereinbefore, the configuration of the preferred embodiment of the present invention has been described. However, note that such embodiment is a mere exemplification of the present invention, and that the present invention is not limited to this at all. It can be easily understood by those skilled in the art that various modifications and changes can be made according to a particular application without departing from the spirit of the present invention.

This application claims priority based on Japanese Patent Application No. 2011-120035 filed on May 30, 2011, and the entire disclosure thereof is incorporated herein.

REFERENCE SIGNS LIST

1 BASEBAND UNIT
2 D/A CONV (DIGITAL/ANALOG CONVERTER)
3 UP CONVERTER
4 PA (POWER AMPLIFIER)
5 FIRST CPL (FIRST DIRECTIONAL COUPLER)
6 BPF (BAND PASS FILTER)
7 SECOND CPL (SECOND DIRECTIONAL COUPLER)
8 SW (HIGH-FREQUENCY SWITCH)
9 DOWN CONVERTER
10 A/D CONV (ANALOG/DIGITAL CONVERTER)
11 MAIN SIGNAL COMPONENT REMOVING CIRCUIT
12 ADDER
13 DISTORTION COMPENSATION CIRCUIT (DPD CIRCUIT)
14 INVERTER
15 DELAY CIRCUIT
16 POWER MEASUREMENT UNIT
17 DETECTOR
18 CIR (CIRCULATOR)
24 PA (POWER AMPLIFIER)

The invention claimed is:

1. A VSWR measurement circuit comprising:
a first directional coupler that extracts a partial main signal of main signals amplified by a power amplifier in order to transmit from an antenna;
an analog/digital converter that converts the main signal extracted by the first directional coupler;
a distortion compensation circuit that performs distortion compensation by using the signal converted by the analog/digital converter;
a second directional coupler that is connected to an antenna terminal through a cable, and extracts a reflection signal included in feedback signals;
a power measurement unit that performs power measurement of the main signal extracted by the first directional coupler and the reflection signal extracted by the second directional coupler, respectively, and measures a VSWR (Voltage Standing Wave Ratio); and
a main signal component removing circuit that removes a main signal component included in the feedback signals to output to the power measurement unit, with a main signal taken out from a preceding stage of the distortion compensation circuit and signals in which the feedback signals are converted into digital signals by the analog/digital converter being set as inputs.

2. The VSWR measurement circuit according to claim 1, wherein
the main signal component removing circuit includes:
an inverter that outputs the main signal taken out from the preceding stage of the distortion compensation circuit as an opposite phase signal;
a delay circuit that delays the signal output from the inverter by a total delay amount from a timing when the main signal is output from the distortion compensation circuit to a timing when the feedback signals converted into the digital signals are returned to the main signal component removing circuit; and
an adder that adds the signals output from the delay circuit and the signals in which the feedback signals extracted by the second directional coupler have been converted into the digital signals, and removes the main signal component included in the feedback signals.

3. The VSWR measurement circuit according to claim 1, wherein as a power level of the main signal used for VSWR measurement, set is a power level corrected by subtracting a loss until power reaches from the first directional coupler to the antenna terminal, from a value obtained by measuring the power level of the main signal extracted by the first directional coupler by the power measurement unit.

4. The VSWR measurement circuit according to claim 1, further comprising a high-frequency switch to switch so that the main signal extracted by the first directional coupler is fed back to the analog/digital converter at a time of power level measurement of the main signal for VSWR and at a time of distortion compensation implementation, and so that the feedback signals extracted by the second directional coupler are switched to be fed back to the analog/digital converter at a time of power level measurement of the reflection signal for VSWR.

5. A radio communication apparatus that transmits and receives a radio signal, comprising the VSWR measurement circuit according to claim 1 as a circuit that measures a VSWR in the cable connected to the antenna terminal and the antenna.

6. A VSWR measurement method comprising:
extracting, by a first directional coupler, a partial main signal of main signals amplified by a power amplifier in order to transmit from an antenna;
converting, by an analog/digital converter, the extracted main signal;
performing distortion compensation, by a distortion compensation circuit, by using the converted signal;
extracting, by a second directional coupler that is connected to an antenna terminal through a cable, a reflection signal included in feedback signals;
by a power measurement unit, performing power measurement of the main signal extracted by the first directional coupler and the reflection signal extracted by the second directional coupler, respectively, and measuring a VSWR (Voltage Standing Wave Ratio); and
removing a main signal component included in the feedback signals to output to the power measurement unit, with a main signal taken out from a preceding stage of the distortion compensation circuit and signals in which the feedback signals are converted into digital signals by the analog/digital converter being set as inputs.

7. The VSWR measurement method according to claim 6, wherein
the main signal component is removed by:
outputting the main signal taken out from the preceding stage of the distortion compensation circuit as an opposite phase signal;
delaying the signal output by the outputting function by a total delay amount from a timing when the main signal is output from the distortion compensation circuit to a timing when the feedback signals converted into the digital signals are returned to the main signal component removing circuit; and
adding the signals output by the delay function and the signals in which the feedback signals extracted by the second directional coupler have been converted into the digital signals, and removing the main signal component included in the feedback signals.

8. The VSWR measurement method according to claim 6, wherein as a power level of the main signal used for VSWR measurement, set is a power level corrected by subtracting a loss until power reaches from the first directional coupler to the antenna terminal, from a value obtained by measuring the power level of the main signal extracted by the first directional coupler by the power measurement unit.

9. The VSWR measurement method according to claim 6, further comprising a switching function to switch so that the main signal extracted by the first directional coupler is fed back to the analog/digital converter at a time of power level measurement of the main signal for VSWR and at a time of distortion compensation implementation, and so that the feedback signals extracted by the second directional coupler are switched to be fed back to the analog/digital converter at a time of power level measurement of the reflection signal for VSWR.

10. A recording medium having a VSWR measurement program stored thereon, wherein the VSWR measurement method according to claim 6 is implemented as a computer-executable program.

\* \* \* \* \*